United States Patent
Prechtl et al.

(10) Patent No.: US 10,573,568 B2
(45) Date of Patent: Feb. 25, 2020

(54) METHOD FOR PRODUCING AN INTEGRATED HETEROJUNCTION SEMICONDUCTOR DEVICE

(71) Applicant: Infineon Technologies Austria AG, Villach (AT)

(72) Inventors: Gerhard Prechtl, Sankt Jakob im Rosental (AT); Gebhart Dippold, Finkenstein (AT)

(73) Assignee: Infineon Technologies Austria AG, Villach (AT)

( * ) Notice: Subject to any disclaimer, the term of this patent is extended or adjusted under 35 U.S.C. 154(b) by 2 days.

(21) Appl. No.: 15/696,664

(22) Filed: Sep. 6, 2017

(65) Prior Publication Data
US 2017/0365520 A1    Dec. 21, 2017

Related U.S. Application Data

(62) Division of application No. 13/338,565, filed on Dec. 28, 2011, now Pat. No. 9,887,139.

(51) Int. Cl.
| | |
|---|---|
| *H01L 21/20* | (2006.01) |
| *H01L 21/8258* | (2006.01) |
| *H01L 29/66* | (2006.01) |
| *H01L 29/732* | (2006.01) |
| *H01L 29/778* | (2006.01) |
| *H01L 29/15* | (2006.01) |
| *H01L 23/60* | (2006.01) |

(52) U.S. Cl.
CPC ........ *H01L 21/8258* (2013.01); *H01L 29/155* (2013.01); *H01L 29/66272* (2013.01); *H01L 29/66462* (2013.01); *H01L 29/7322* (2013.01); *H01L 29/7787* (2013.01); *H01L 23/60* (2013.01); *H01L 2924/0002* (2013.01)

(58) Field of Classification Search
None
See application file for complete search history.

(56) References Cited

U.S. PATENT DOCUMENTS

| | | |
|---|---|---|
| 9,748,224 B2 | 8/2017 | Padmanabhan et al. |
| 2002/0190270 A1 | 12/2002 | Emrick |
| 2003/0020090 A1* | 1/2003 | Heck .................. H01L 21/8221 257/146 |
| 2008/0124889 A1 | 5/2008 | Roggenbauer et al. |
| 2008/0315257 A1 | 12/2008 | Shiraishi |
| 2009/0050939 A1 | 2/2009 | Briere |

(Continued)

OTHER PUBLICATIONS

Chumbes, Eduardo M. et al, "AlGaN/GaN High Electron Mobility Transistors on Si(111) Substrates", IEEE Transactions on Electron Devices, vol. 48, No. 3, Mar. 2001, pp. 420-426.

(Continued)

*Primary Examiner* — Abul Kalam
(74) *Attorney, Agent, or Firm* — Murphy, Bilak & Homiller, PLLC

(57) ABSTRACT

A method of producing a semiconductor component is provided. The method includes providing a silicon substrate having a <111>-surface defining a vertical direction, forming in the silicon substrate at least one electronic component, forming at least two epitaxial semiconductor layers on the silicon substrate to form a heterojunction above the <111>-surface, and forming a HEMT-structure above the <111>-surface.

7 Claims, 18 Drawing Sheets

(56) References Cited

U.S. PATENT DOCUMENTS

| | | |
|---|---|---|
| 2009/0189191 A1 | 7/2009 | Sato et al. |
| 2010/0200920 A1 | 8/2010 | Su et al. |
| 2010/0301396 A1 | 12/2010 | Briere |
| 2011/0210337 A1 | 9/2011 | Briere |
| 2012/0153300 A1 | 6/2012 | Lidow et al. |
| 2012/0218783 A1 | 8/2012 | Imada |
| 2013/0168737 A1 | 7/2013 | Prechtl et al. |
| 2014/0159119 A1 | 6/2014 | Derluyn et al. |
| 2014/0346570 A1 | 11/2014 | Ueno |
| 2017/0200817 A1 | 7/2017 | Curatola et al. |

OTHER PUBLICATIONS

Chung, J. W. et al., "GaN-on-Si Technology, A New Approach for Advanced Devices in Energy and Communications", Proceedings of the European Solid-State Device Research Conference, Sevilla, Spain, Sep. 2010, pp. 52-56.

Derluyn, J. et al., "Low Leakage High Breakdown E-Mode GaN DHFET on Si by Selective Removal of In-Situ Grown $Si_3N_4$,", IEEE International Electron Devices Meeting, Baltimore, MD, USA, Dec. 2009, pp. 157-160.

\* cited by examiner

METHOD FOR PRODUCING AN INTEGRATED HETEROJUNCTION SEMICONDUCTOR DEVICE

TECHNICAL FIELD

Embodiments of the present invention relate to integrated heterojunction semiconductor devices, in particular to integrated heterojunction semiconductor devices having a HEMT formed on a silicon semiconductor structure and to related methods for producing integrated heterojunction semiconductor devices.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (High Electron Mobility Field Effect Transistor) have been used for various applications including but not limited to use as switches in power supplies and power converters, electric cars, air-conditioners, and in consumer electronics, for example stereo systems and communication technology.

In recent years, HEMTs have found wider use in low loss high frequency and low loss high power applications. In particular, Gallium nitride (GaN) based HEMT-devices have been found to be well suited for use in DC rectifiers, power microwave and radar amplifiers, low noise amplifiers, and high temperature elements, etc. Gallium nitride (GaN) material shows a high polarization effect, including spontaneous polarization and piezoelectric polarization. Even without being doped, this polarization effect allows forming a two-dimensional-electron gas (2DEG) adjacent to an interface (heterojunction) of a GaN/AlGaN (gallium nitride/aluminum gallium nitride) heterojunction structure (or GaN/AlInGaN, AlGaN/AlInGaN, aluminum indium gallium nitride). In a 2DEG, the electron concentration is related to the intensity of polarization. 2DEG sheet electron concentration of GaN/AlGaN heterojunction structures can reach very high values. Therefore, field-effect-transistors based on GaN/AlGaN heterojunction structures are able to control very large current.

Often different functions are desired to be integrated in a single device or integrated circuit (IC) to minimize cost, size and weight of the electronics. However, existing concepts for combining GaN based HEMTs with widely used silicon based devices, for example silicon based CMOS (Complementary Metal Oxide Semiconductor) devices, result in high manufacturing costs.

Accordingly, there is a need to provide cost-effective methods for forming integrated semiconductor devices in GaN-on-silicon technology.

SUMMARY

According to an embodiment of a method of producing a semiconductor device, the method includes: providing a silicon substrate having a <111>-surface defining a vertical direction; forming in the silicon substrate at least one electronic component; forming at least two epitaxial semiconductor layers on the silicon substrate to form a heterojunction above the <111>-surface; and forming a HEMT-structure above the <111>-surface.

According to an embodiment of a method of producing a semiconductor device, the method includes: providing a <111>-silicon wafer with a first surface defining a vertical direction; forming in the <111>-silicon wafer at least one of a resistor and a bipolar semiconductor structure; forming at least two wide band-gap semiconductor layers on the <111>-silicon wafer by epitaxial deposition; and forming a HEMT-structure in the at least two wide band-gap semiconductor layers.

According to an embodiment of a method of producing a semiconductor device, the method includes: providing a <111>-silicon wafer with a first surface defining a vertical direction; forming at least two wide band-gap semiconductor layers on the <111>-silicon wafer by epitaxial deposition to form a heterojunction above the first surface; forming a HEMT-structure above the first surface; partly removing the at least two wide band-gap semiconductor layers to expose a portion of the first surface; and forming at least one electronic component below the heterojunction.

According to an embodiment of a semiconductor device, the semiconductor device includes: a first semiconductor body comprising at least one electronic component and being formed by a monocrystalline silicon substrate having a <111>-surface defining a vertical direction; a second semiconductor body arranged on and in contact with the <111>-surface and comprising a HEMT-structure comprising a heterojunction and a gate electrode arranged above the heterojunction. The at least one electronic component is completely arranged below the heterojunction.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
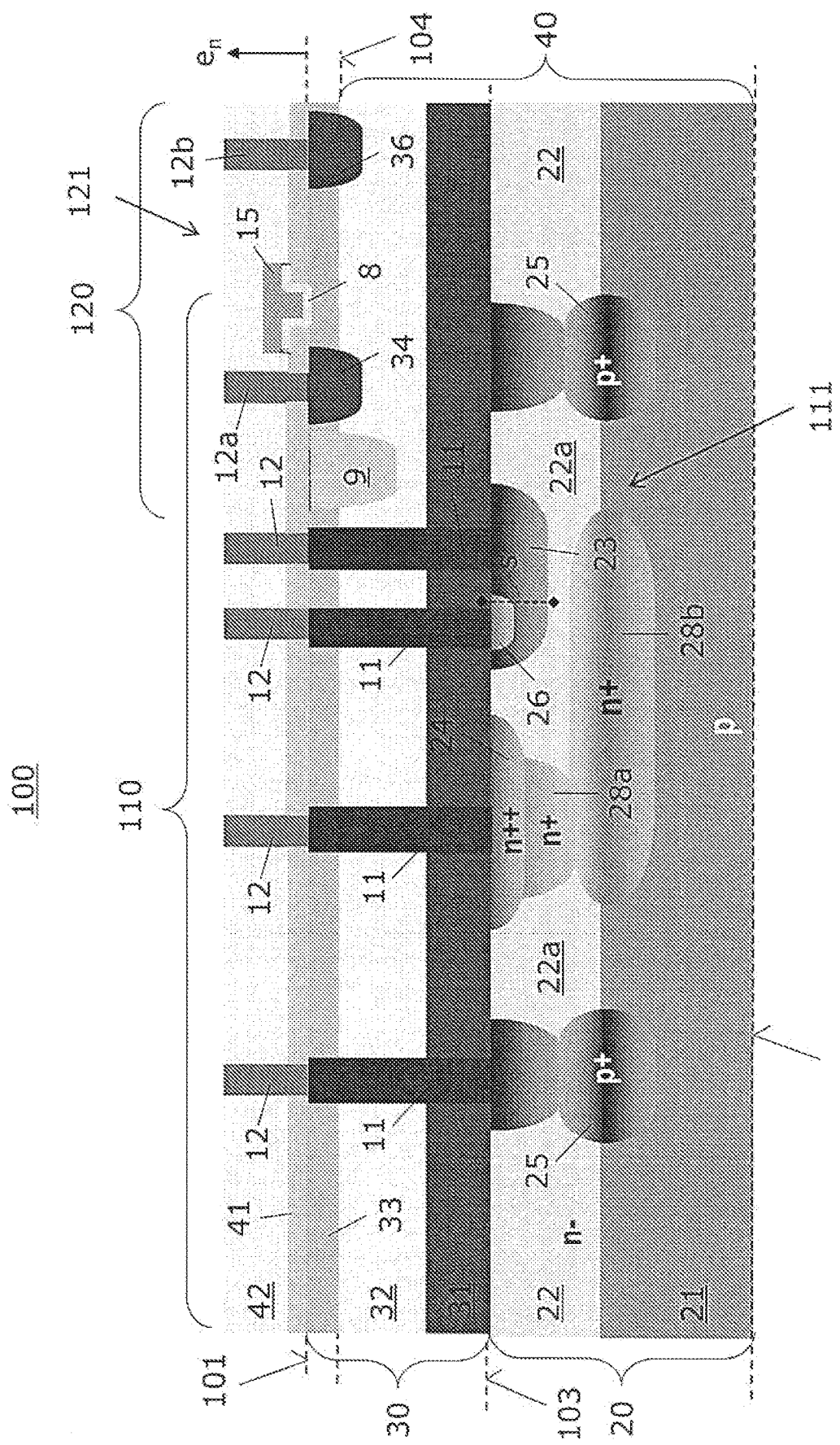
FIG. 1 illustrates a vertical cross-section through a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described.

Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, integrated heterojunction semiconductor devices having a HEMT formed on a silicon semiconductor structure having at least one electronic component, for example CMOS-structure or a bipolar structure, and to related methods for producing integrated heterojunction semiconductor devices. The formed semiconductor device is typically a planar semiconductor device contacted from one side only. Typically, the HEMT is a power semiconductor component.

The term "power semiconductor component" as used in this specification intends to describe a semiconductor component on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" and/or control of conductivity and/or shape of the channel in a semiconductor region using an insulated gate electrode or a Schottky-gate electrode.

In the context of the present specification, the term "gate electrode" intends to describe an electrode which is situated next to, and insulated from the semiconductor body and configured to form and/or control a channel region.

In the context of the present specification, the terms "field plate" and "field electrode" intend to describe an electrode which is arranged next to a semiconductor region, typically the drift region, insulated from the semiconductor region, and configured to expand a depleted portion in the semiconductor region by applying an appropriate voltage, typically a negative voltage for an n-type drift region.

In the context of the present specification, the term "mesa" or "mesa region" intends to describe a semiconductor region between two adjacent trenches extending into the semiconductor substrate or body in a vertical cross-section.

FIG. 1 illustrates a vertical cross-section through an integrated semiconductor device 100. Semiconductor device 100 includes a first semiconductor body 20. The first semiconductor body 20 is formed by a monocrystalline silicon substrate having a <111>-surface 103 defining a vertical direction $e_n$. In the following the first semiconductor body 20 is also referred to as <111>-semiconductor body.

The first semiconductor body 20 can be a single bulk mono-crystalline material. It is also possible that the semiconductor body 20 includes a bulk mono-crystalline material 21 and at least one epitaxial layer 22 formed thereon. Using the epitaxial layer(s) 22 provides more freedom in tailoring the background doping of the material since the doping concentration can be adjusted during deposition of the epitaxial layer or layers.

In the exemplary embodiment illustrated in FIG. 1, the first semiconductor body 20 includes a p-type semiconductor layer 21 forming a common substrate and extending to a back surface 102, and an n$^-$-type semiconductor layer 22 arranged on the p-type semiconductor layer 21. The doping relations in the Figures may also be reversed.

Within the n$^-$-type semiconductor layer 22 an electronic component 111 is formed. In the exemplary embodiment, electronic component 111 is formed as a lateral bipolar transistor. In a portion 22a of the n$^-$-type semiconductor layer 22, a p-type base region 23 and an n$^{++}$-type collector region 24 are embedded. Within the p-type base region 23 an n$^+$-type emitter region 26 is embedded. In the exemplary embodiment, the electronic component 111 is formed as an npn-transistor. The electronic component 111 may however include or be formed as a pnp-transistor, a diode and/or a resistor.

Typically, the electronic component 111 is formed in a well 22a which is laterally separated by p$^+$-type semiconductor regions 25 connected to a reference potential, typically grounded. Furthermore, an n$^+$-type buried layer 28b is typically formed between the well 22a and common substrate 21 and electrically connected to the collector region 24 via an n$^+$-type contact region 28a. Accordingly, the electronic component 111 formed in the well 22a is protected against cross-talk resulting from other integrated components. The p$^+$-type semiconductor regions 25 are in the following also referred as well-isolating regions. The well-isolating regions 25 extend from the <111>-surface 103 at least partially into the p-type semiconductor layer 21. Further, the well-isolating regions 25 may have upper and lower portions as illustrated in FIG. 1.

The n⁻-type semiconductor layer 22 may include several electronic components 111 arranged in different wells which are electrically decoupled from each other by respective well-isolating regions 25. Accordingly, cross-talk protected circuits may be provided in the first semiconductor body 20. Such circuits may include driver circuits, sensors and ESD (Electrostatic discharge) protection circuits, for example for a HEMT-structure 121 next to a heterojunction 104 formed in a second semiconductor body 30 above the first semiconductor body 20.

In the exemplary embodiment, the second semiconductor body 30 is arranged on the first semiconductor body 20 in contact with the <111>-surface 103 and completely covers the first semiconductor body 20. Accordingly, the first semiconductor body 20 and the second semiconductor body 30 form a common semiconductor body 40 with a heterojunction 104 and the electronic component 111 arranged below the heterojunction 104. The interface between the first semiconductor body 20 and the second semiconductor body 30 is also a heterojunction.

In the exemplary embodiment, the HEMT-structure 121 includes an insulated gate electrode 15 arranged above the heterojunction 104 and insulated from the second semiconductor body 30 by a gate dielectric 8, for example a gate oxide.

Typically, the electronic component 111 and the HEMT-structure 121 at least partially overlap when seen in the vertical direction. Accordingly, device area may be saved and thus manufacturing costs per device reduced.

According to an embodiment, the integrated semiconductor device 100 includes a first area 110, in which one or several silicon semiconductor devices 111 are arranged in a <111>-semiconductor substrate, and a second area 120 which at least partially overlaps with the first area 110 when seen in vertical direction and in which a HEMT-structure 121 is arranged next to a heterojunction 104 such that the one or several silicon semiconductor devices 111 are arranged below the heterojunction 104.

Typically, the second semiconductor body 30 is formed by layers of a wide band-gap semiconductor material. In the exemplary embodiment, a substantially non-doped GaN-layer 31 is arranged on and in contact with the underlying semiconductor layer 22. Typically, the GaN-layer 31 is formed directly on the <111>-surface 103 by epitaxial deposition. The GaN-layer 31 typically forms a buffer layer 31 of high resistivity. A further high resistivity GaN-layer 32 and an AlGaN (aluminum gallium nitride) layer 33 is formed on the buffer layer 31 and GaN-layer 32, respectively. In the exemplary embodiment, the heterojunction 104 is formed between the further GaN-layer 32 and the AlGaN-layer 33. Alternatively, a graded buffer such an AlGaN buffer layer 31 or an AlN/GaN/AlN/GaN superlattice-structure may be formed instead of the illustrated GaN-layer 31.

Furthermore, GaN/InAlGaN-heterostructures or AlGaN/AlInGaN heterostructures may be formed instead of the GaN/AlGaN-heterostructure by epitaxial deposition.

The HEMT-structure 121 further includes a source region 34, a drain region 36 and channel region extending in the further GaN-layer 32 at the heterojunction 104 between the source region 34 and the drain region 36. In the exemplary embodiment, the source region 34 and the drain region 36 are highly n-doped, while the AlGaN-layer 33 and the further GaN-layer 32 are n-doped and substantially non-doped, respectively. Furthermore, the AlGaN-layer 33 may also be substantially not-doped. Due to the spontaneous and piezoelectric polarization between the AlGaN/GaN interface, a positive net charge is formed leading to an attraction of electrons. These electrons are provided by surfaces charges (interface between AlGaN/Nitride) leading to the formation of a two dimensional high mobility electron gas within a thin channel layer of about 10 nm. The conductivity of the thin channel layer may be controlled by the insulated gate electrode 15. Alternatively, a non-insulated Schottky gate may be used to control the conductivity of the thin channel layer.

On the main surface 101 of the second semiconductor body 30 and common semiconductor body 40, respectively, one or several insulating layers 41, 42, for example a silicon nitride layer 41 and a silicon oxide layer 42, are typically formed. Furthermore, a lateral insulation 9, typically also made of silicon oxide or simply by an Argon implantation, surrounds the HEMT-structure 121 in vertical cross-sections to insulate the HEMT-structure 121 from other structures formed in the common semiconductor body 40. The vertical cross-section illustrated in FIG. 1 typically corresponds only to a section.

To electrically contact the electronic component 111 in the first semiconductor body 20, contact plugs 11, for example doped poly-silicon plugs, extend through the second semiconductor body 30. Furthermore, metal plugs 12, 12a, 12b extend through the one or several insulating layers 41, 42 to electrically contact the contact plugs 11 of electronic component 111 and HEMT-structure 121, respectively. Metal plugs 12a and 12b are used to contact the source region 34 and the drain region 36 of the HEMT-structure 121, respectively. The gate electrode 15 is typically connected via a further metal plug in a different vertical cross-section.

Figure 2:
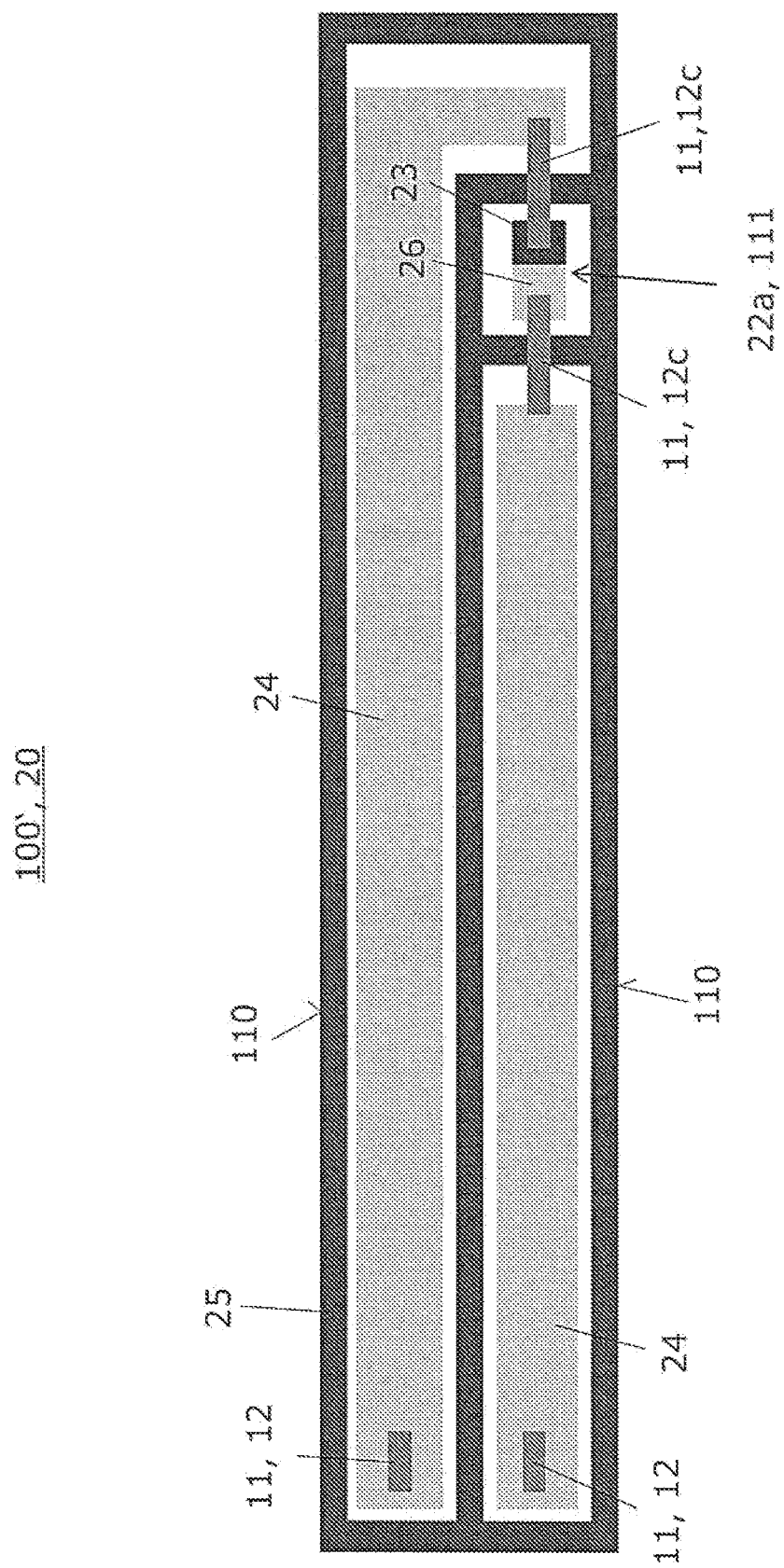
FIGS. 2 and 3 illustrate in plane views a layout of a similar semiconductor device as illustrated in FIG. 1 according to embodiments.
Figure 3:
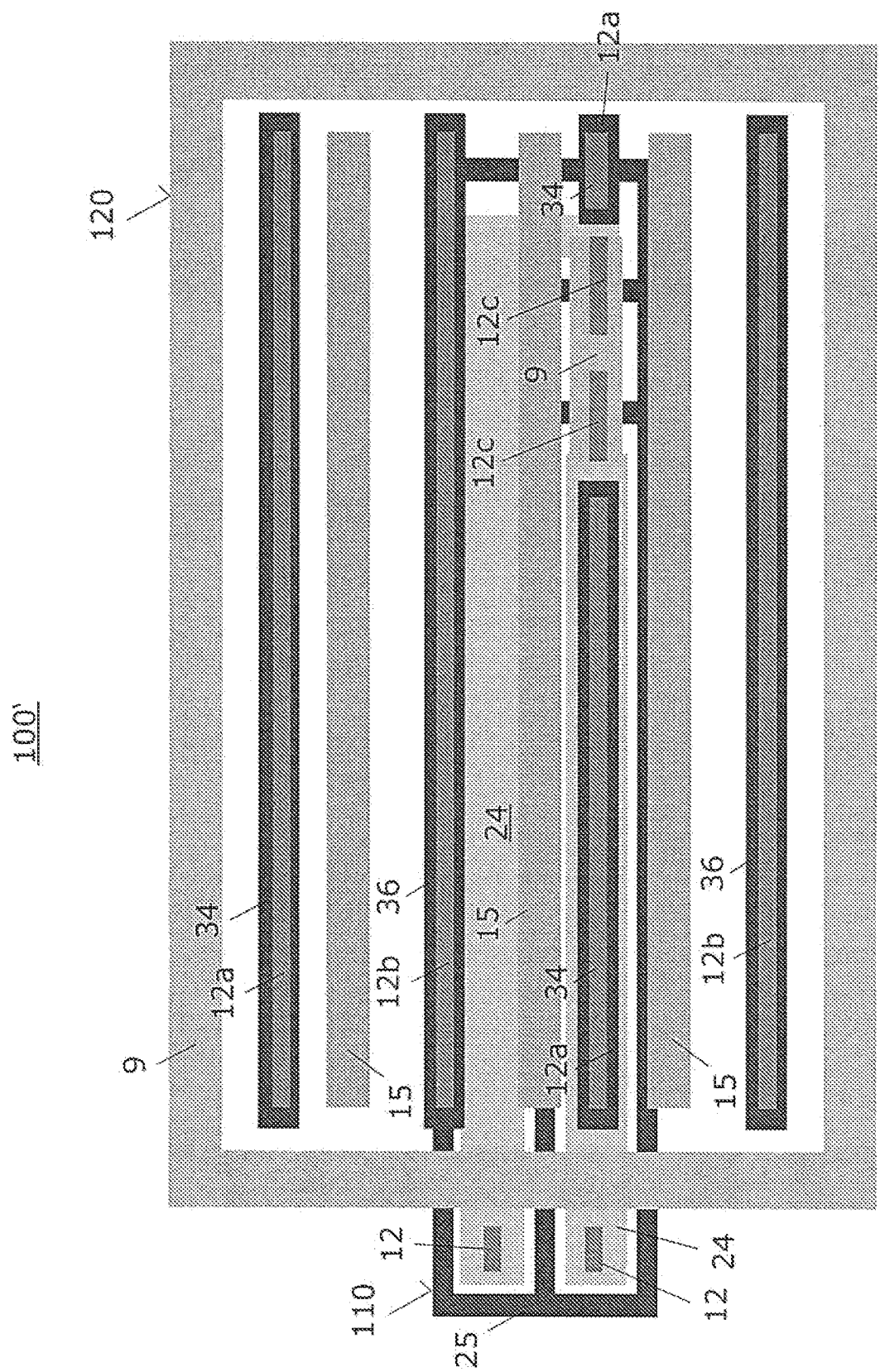

FIGS. 2 and 3 illustrate in plane views a layout of a semiconductor device 100'. The semiconductor device 100' shown in FIGS. 2 and 3 is similar to the semiconductor device 100 explained above with regard to FIG. 1. However, the first semiconductor body 30 of the semiconductor device 100' includes a bipolar diode instead of a bipolar transistor. In the exemplary embodiment, a pn-diode is formed in well 22a by an n-doped region 26 and a p-doped region 23 and contacted via contact plugs 11 and metal bridges 12c to neighboring wells of highly doped regions 24 as illustrated in FIG. 2. Further contact plugs 11 and metal plugs 12 are used to electrically contact the highly doped regions 24 to two terminals arranged on the semiconductor device 100' and/or further circuitry used as an evaluation circuit for the diode 111 used as a temperature sensor of semiconductor device 100'. FIG. 3 illustrates an overlay of the layout of FIG. 2 and a layout of the HEMT-structure in the second semiconductor body 30 including the insulated gate electrode 15 arranged on the second semiconductor body 30 and the metal plugs 12a. Within lateral insulation 9 a plurality of HEMTs may be formed to enable larger current switching capability.

Figure 4:
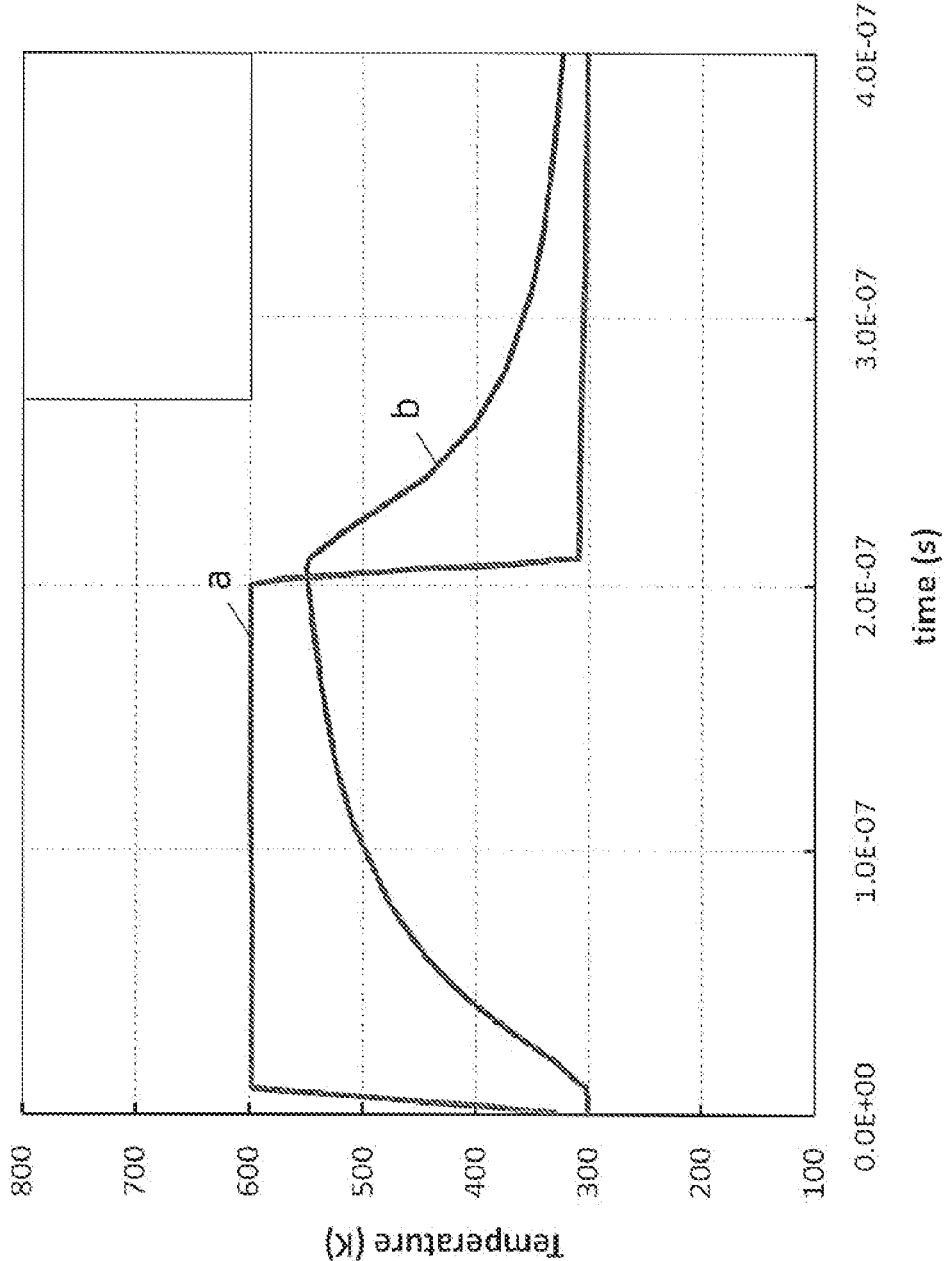
FIG. 4 illustrates a temperature response of a semiconductor device as illustrated in FIGS. 1 to 3.

FIG. 4 illustrates a temperature response of the semiconductor device 100' as explained above with regard to FIGS. 1 to 3 according to a simulation. Due to the high thermal conductivity of GaN and Si, a temperature increase in the channel region of the HEMT (curve a) may be detected in the silicon semiconductor body with only a short delay (curve b). Accordingly, a simple and reliable temperature monitoring of the HEMT-structure may be provided.

Figure 5:
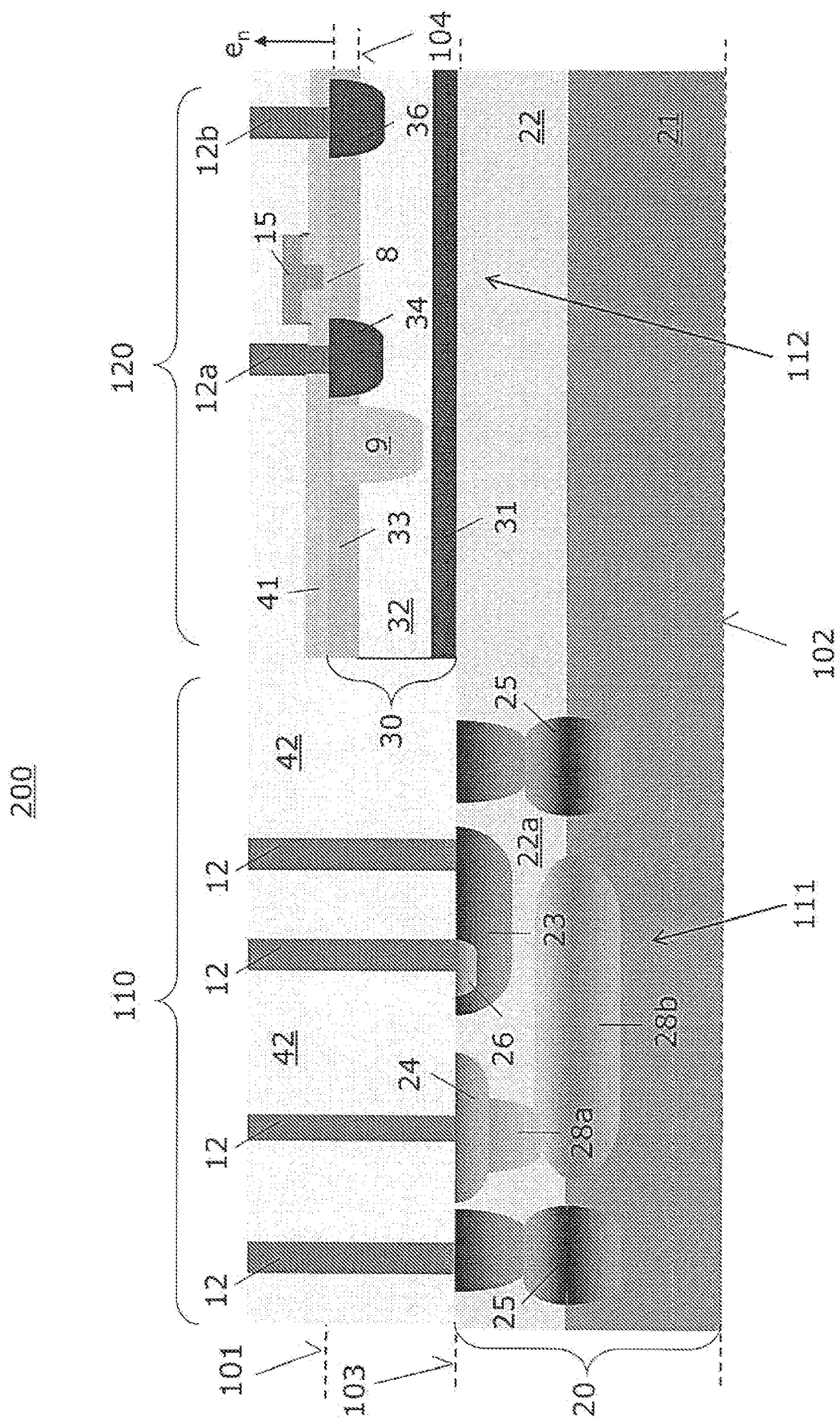
FIG. 5 illustrates a vertical cross-section through a semiconductor device according to an embodiment.

FIG. 5 illustrates a vertical cross-section through a semiconductor device 200. The semiconductor device 200 shown in FIG. 5 is similar to the semiconductor device 100 explained above with regard to FIG. 1. However, the second semiconductor body 30 covers the first semiconductor body 20 only partly in the illustrated vertical cross-section. The remaining part of the <111>-surface is covered with an insulating layer 42. For contacting the electronic component 111, only metal contacts 12 are used in the exemplary embodiment.

Figure 6:
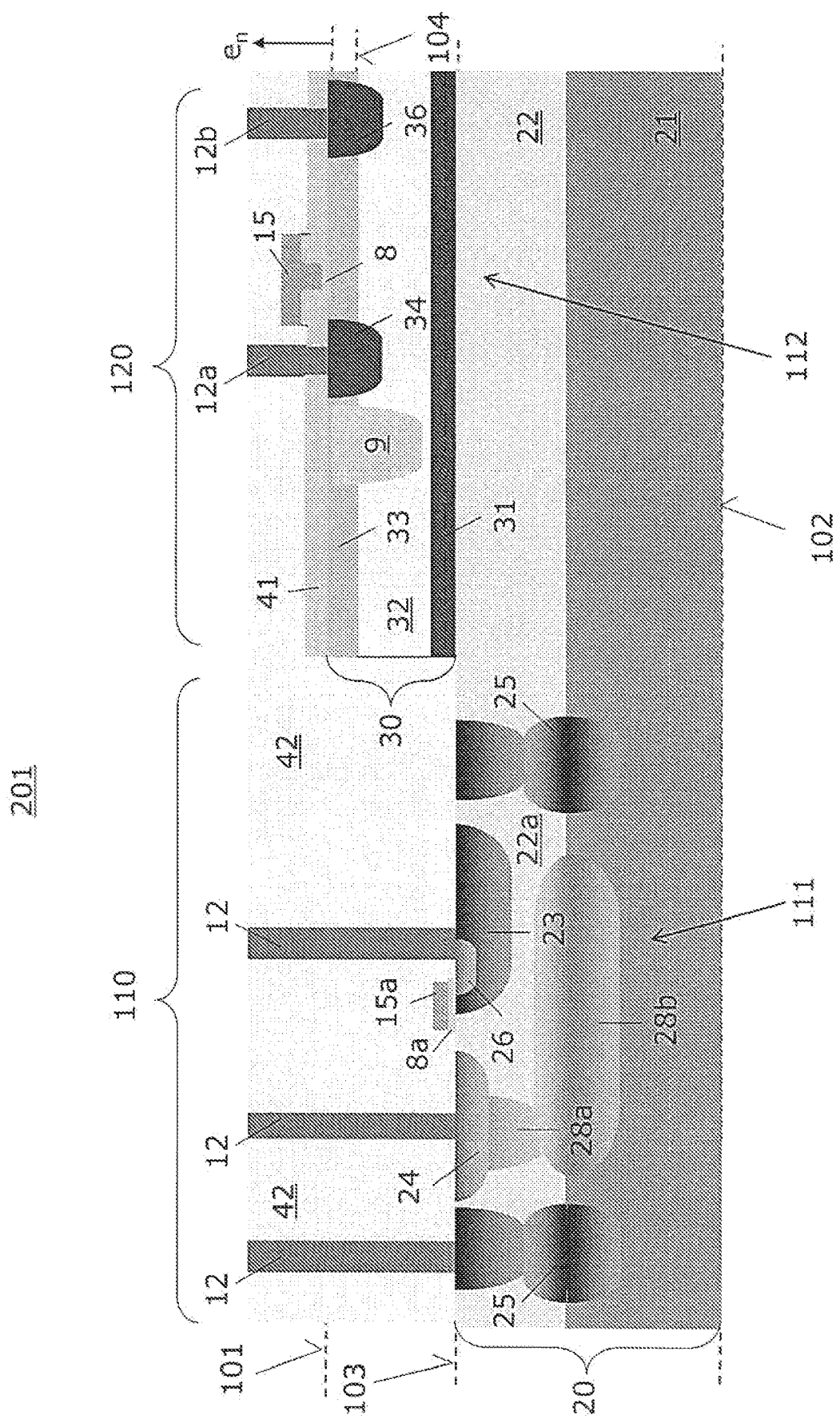
FIG. 6 illustrates a vertical cross-section through a semiconductor device according to an embodiment.

FIG. 6 illustrates a vertical cross-section through a semiconductor device 201. The semiconductor device 201 shown in FIG. 6 is similar to the semiconductor device 200 explained above with regard to FIG. 5. However, the first semiconductor body 20 includes an exemplary FET (Field Effect Transistor)-structure 111, in particular a lateral MOSFET-structure with a source region 26, a body region 23, a drain region 24 and a gate electrode 15a arranged on and insulated by a gate dielectric 8a from the first semiconductor body 20. This is however only an example. The first semiconductor body 20 may include a complex circuitry formed e.g. in CMOS-technology. As will be explained in more detail below, the electronic component 111 of the semiconductor devices 200, 201 are typically formed after forming the HEMT-structure. Accordingly, comparatively complex circuits may be formed.

FIGS. 7 to 12 illustrate a method of forming a semiconductor device 100. FIGS. 7 to 12 show vertical cross-sections through the semiconductor device 100 during or after particular method steps. In a first process, a semiconductor body 20, for example a Si-wafer or Si-substrate 20, having a <111>-surface 103 defining a vertical direction $e_n$ and a back surface 102 which is opposite the <111>-surface 103 is provided. Typically, the semiconductor body 20 includes a first semiconductor layer 21 (e.g. p-type) or common substrate 21 extending to the back surface 102 and a second semiconductor layer 22 (e.g. n-type) extending to the <111>-surface 103 and forming a pn-junction with the first semiconductor layer 21.

Figure 7:
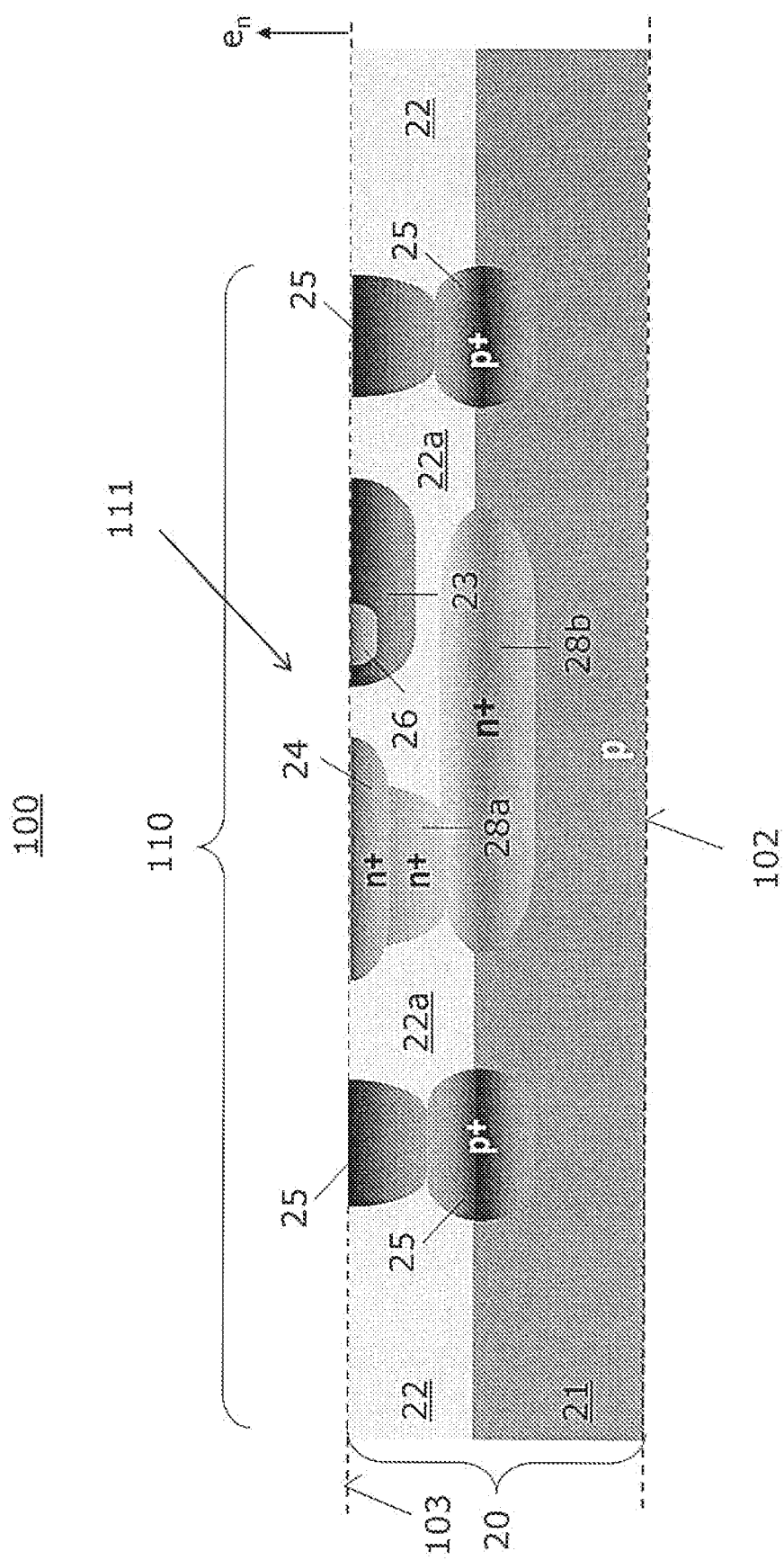
FIGS. 7 to 12 illustrate vertical cross-sections through a semiconductor device during method steps of a method according to embodiments.

Thereafter, an electronic component 111 is formed in the first semiconductor body 20. For example, a laterally separated well 22a is formed by forming $p^+$-type semiconductor regions 25 extending from the <111>-surface 103 into the first semiconductor layer 21. Furthermore, an $n^+$-type buried layer 28b is typically formed between the well 22a and the common substrate 21. Further, an $n^+$-type contact region 28a may be formed above and in contact with the buried layer 28b. A p-type base region 23 may be formed. An $n^+$-type drain region 24 above and in contact with the contact region 28a and an $n^+$-type source region 26 embedded in the base region 23 may be formed. The resulting semiconductor structure 100 includes a bipolar transistor 111 and is illustrated in FIG. 7. This is however only an example. Alternatively or in addition, a diode, a resistor or a complete bipolar circuit may be formed in the first semiconductor body 20. Typically, the different semiconductor regions 23 to 26, 28a and 28b are formed by implantation and a subsequent thermal drive-in process. According to an embodiment, the drive-in process is performed later during forming of epitaxial layers on the first semiconductor body 20.

Figure 8:
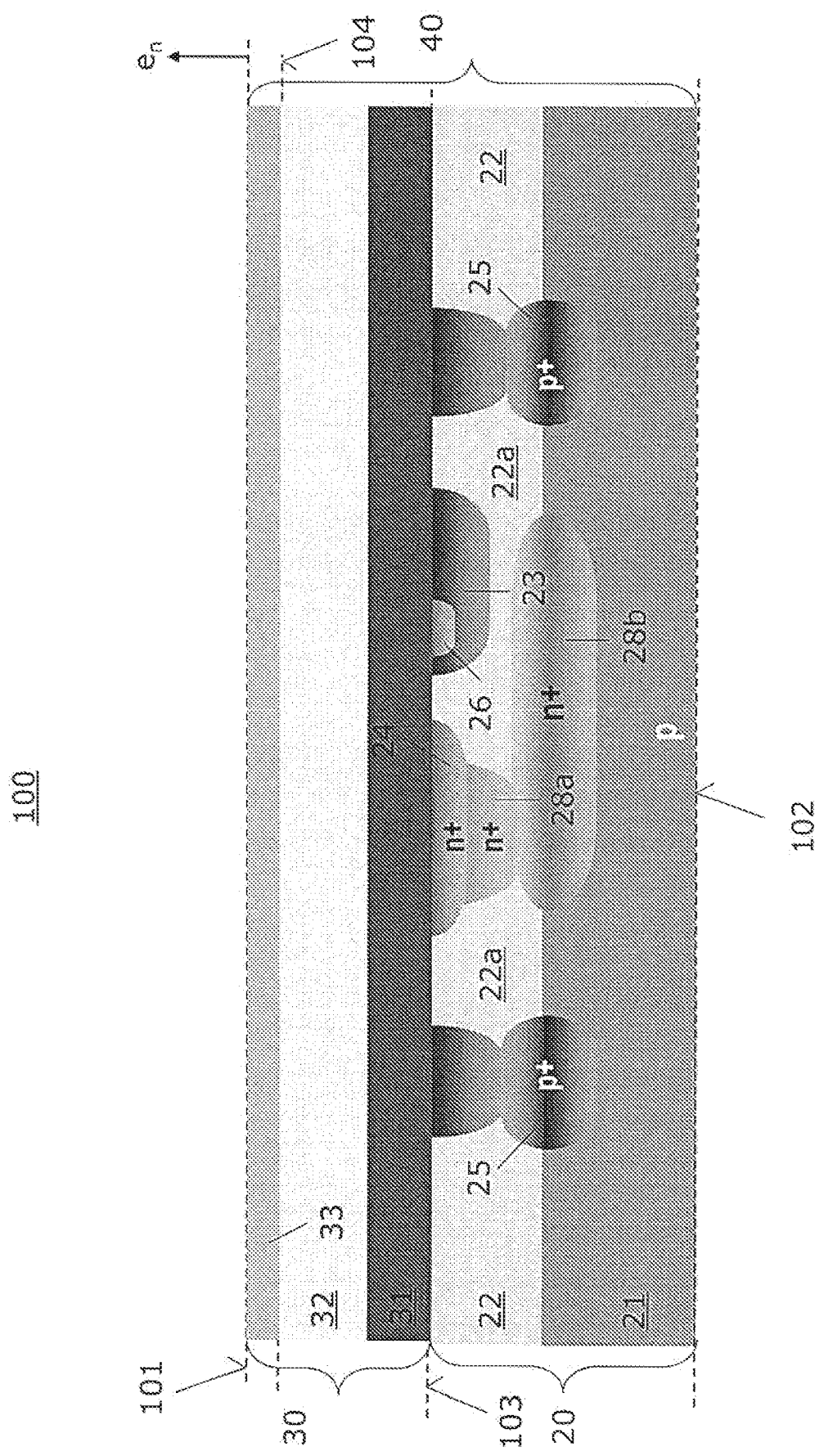

Referring to FIG. 8, three wide band-gap semiconductor layers 31, 32, 33 are formed on the <111>-surface 103 by epitaxial deposition. In the exemplary embodiment, a substantially non-doped buffer layer 31 in contact with the <111>-surface 103 is formed by epitaxial deposition of GaN or using graded buffer techniques for forming several layers of Al(x)Ga(1-x)N with x ranging between 0 and 1, or superlattice-structures like a stack of AlN/GaN/AlN/GaN. Thereafter, a further substantially non-doped GaN-layer 32 is formed on the buffer layer 31 by epitaxial deposition. A heterojunction 104 is formed above the <111>-surface 103 by epitaxial deposition of an n-type AlGaN-layer 33 on the GaN-layer 32. Alternatively, AlN or $In_xAl_yGa_{(1-x-y)}N$ with x and y as well as x+y ranging between 0 and 1 may be epitaxially deposited on the GaN-layer 32 to form the heterojunction 104.

For epitaxially depositing GaN/AlGaN on silicon of desired heights to form HEMTs, the first semiconductor body 20 may be exposed to temperatures of about 1000° C. to about 1200° C. for about one to two hours. Accordingly, the drive-in process of the implanted dopants in the first semiconductor body 20 may be performed at least partially during depositing the GaN/AlGaN-layers 31 to 33. As will be shown in more detail below, this allows forming of well-functioning bipolar components in the first semiconductor body 20. In addition, out-diffusion of dopants from the first semiconductor body 20 into the GaN-layers 31, 32 is neglectable at these temperature loads.

Figure 9:
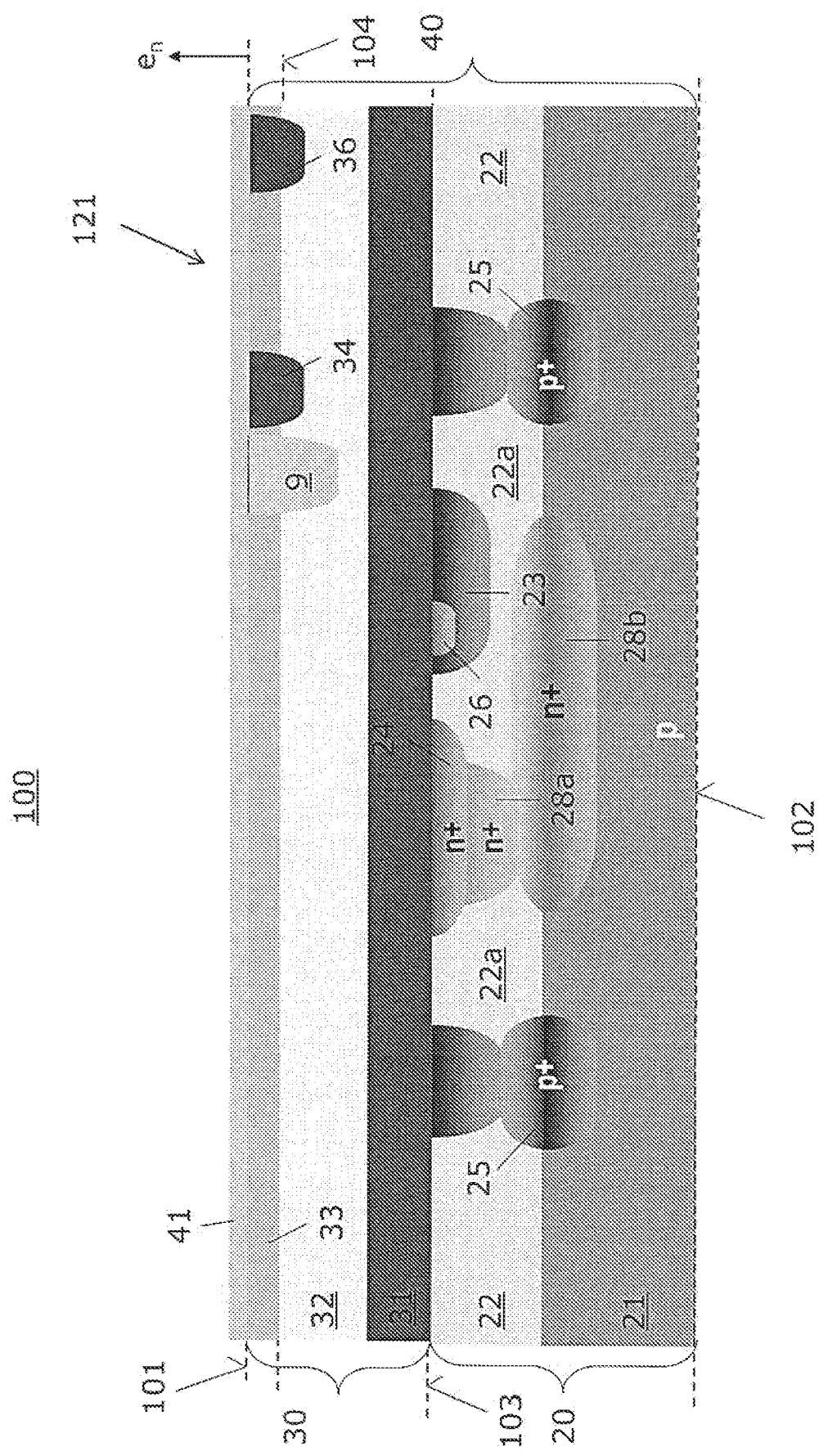

Thereafter, an $n^+$-type source region 34 and an $n^+$-type drain region 36 extending across the heterojunction 104 may be formed by implantation and drive-in using a temperature of about 1000° C. to 1200° C. for about 5 min to about 6 hours. Further, a lateral insulation 9 of the HEMT-structure 121 is formed. Forming the lateral insulation 9 typically includes etching a shallow trench and deposition of silicon oxide or Ar damage implantation. The resulting semiconductor structure 100 is illustrated in FIG. 9 after further depositing a SiN-layer (silicon nitride) 41 on the upper surface 101 of the AlGaN-layer 32 and the second semiconductor body 30 formed by the semiconductor layers 31 to 33, respectively.

Figure 10:
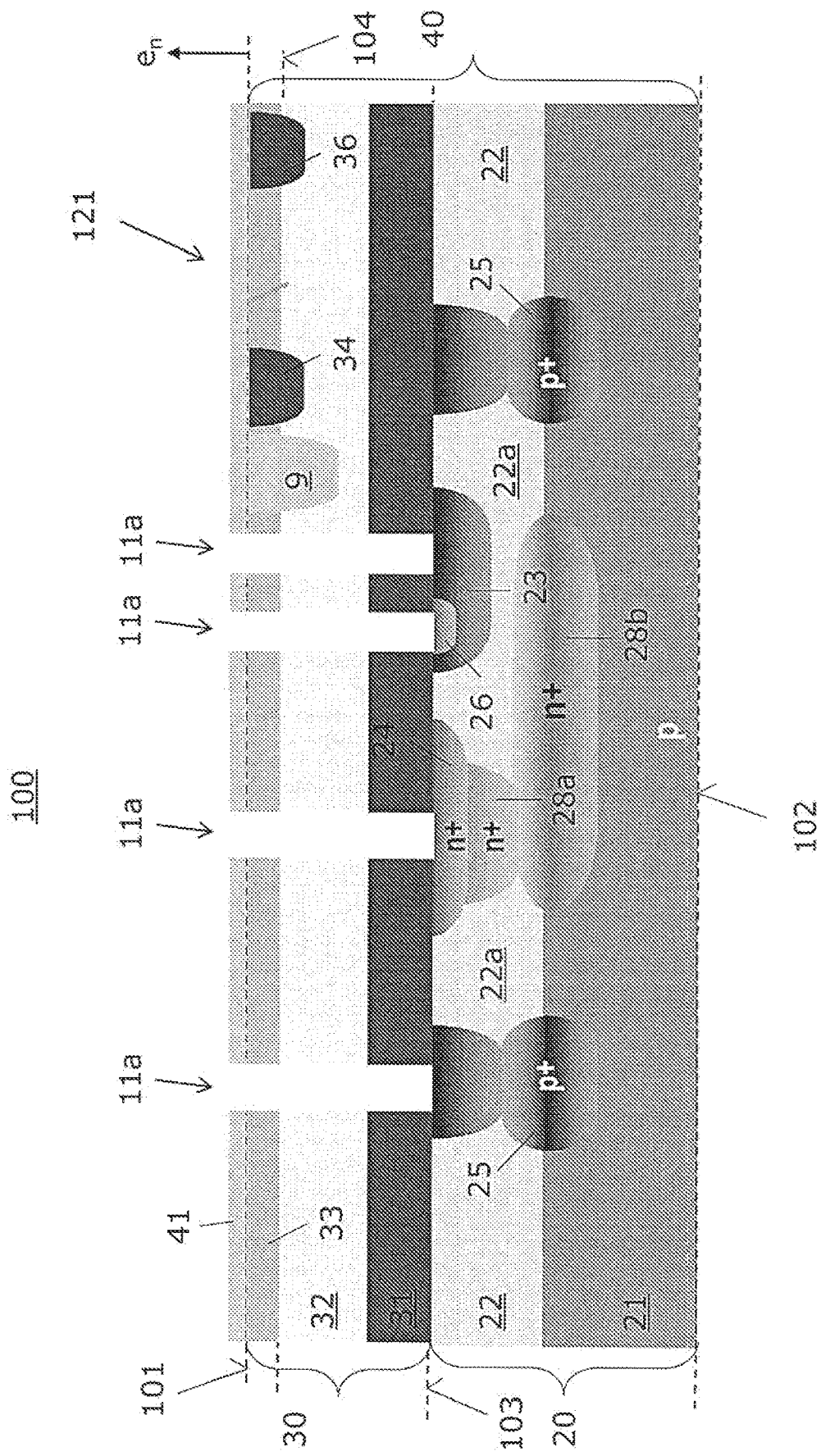

Thereafter, the SiN-layer 41 is structured to form a mask for subsequent etching of deep vertical trenches 11a through the epitaxial semiconductor wide band-gap layers 31, 32, 33 to expose the first semiconductor body 20 in contact regions as illustrated in FIG. 10.

Figure 11:
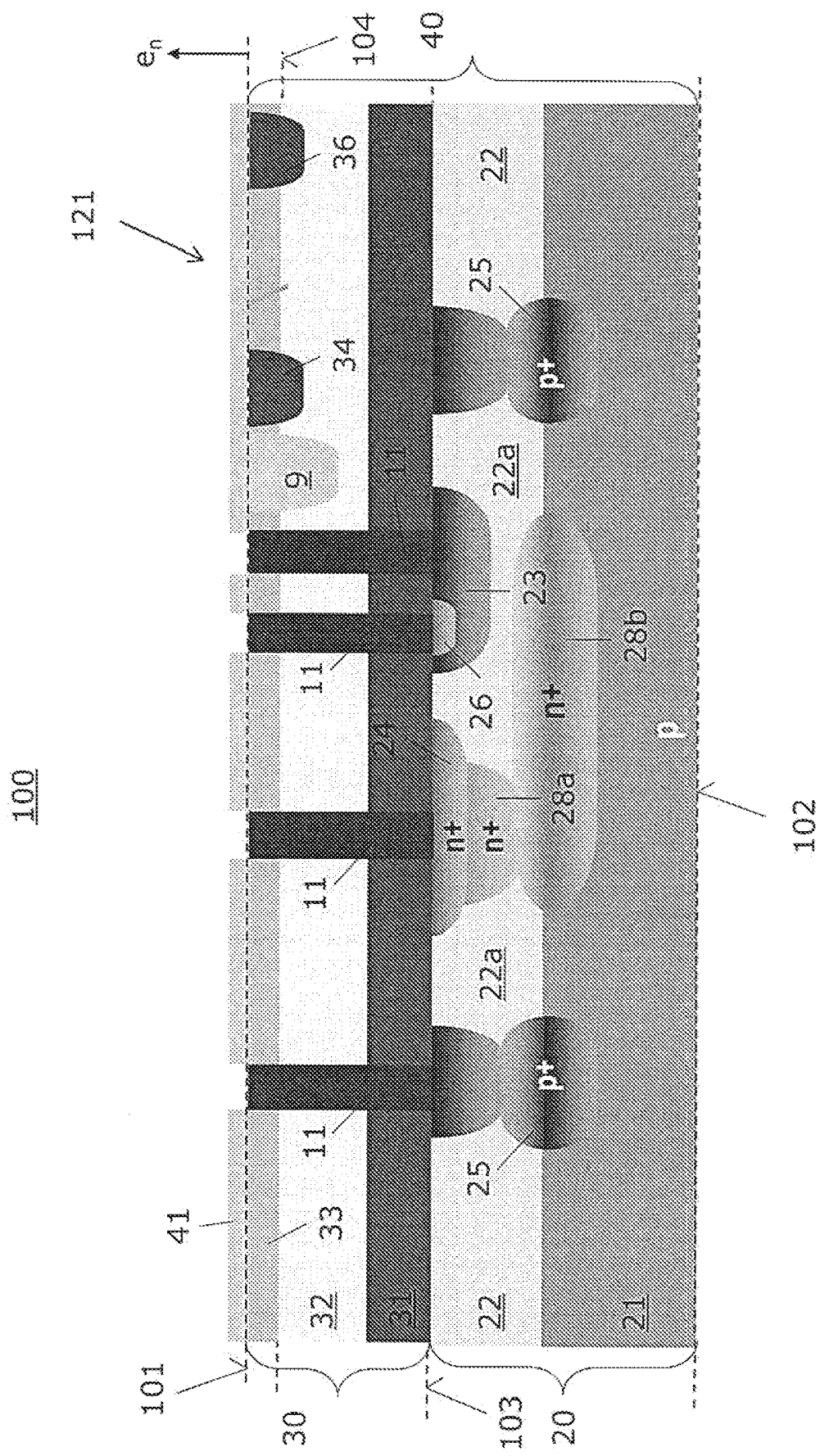

Referring to FIG. 11, through contacts 11 are formed in the deep vertical trenches 11a, for example by deposition of doped poly-silicon and back etching of the poly-Si. Alternatively or in addition, the deposited poly-Si may be removed from the SiN-layer 41 in a CMP (Chemical Mechanical Polishing)-process using the SiN-layer 41 as a CMP-stop. Instead of poly-Si, metal such as tungsten may be used to form the through contacts 11.

Figure 12:
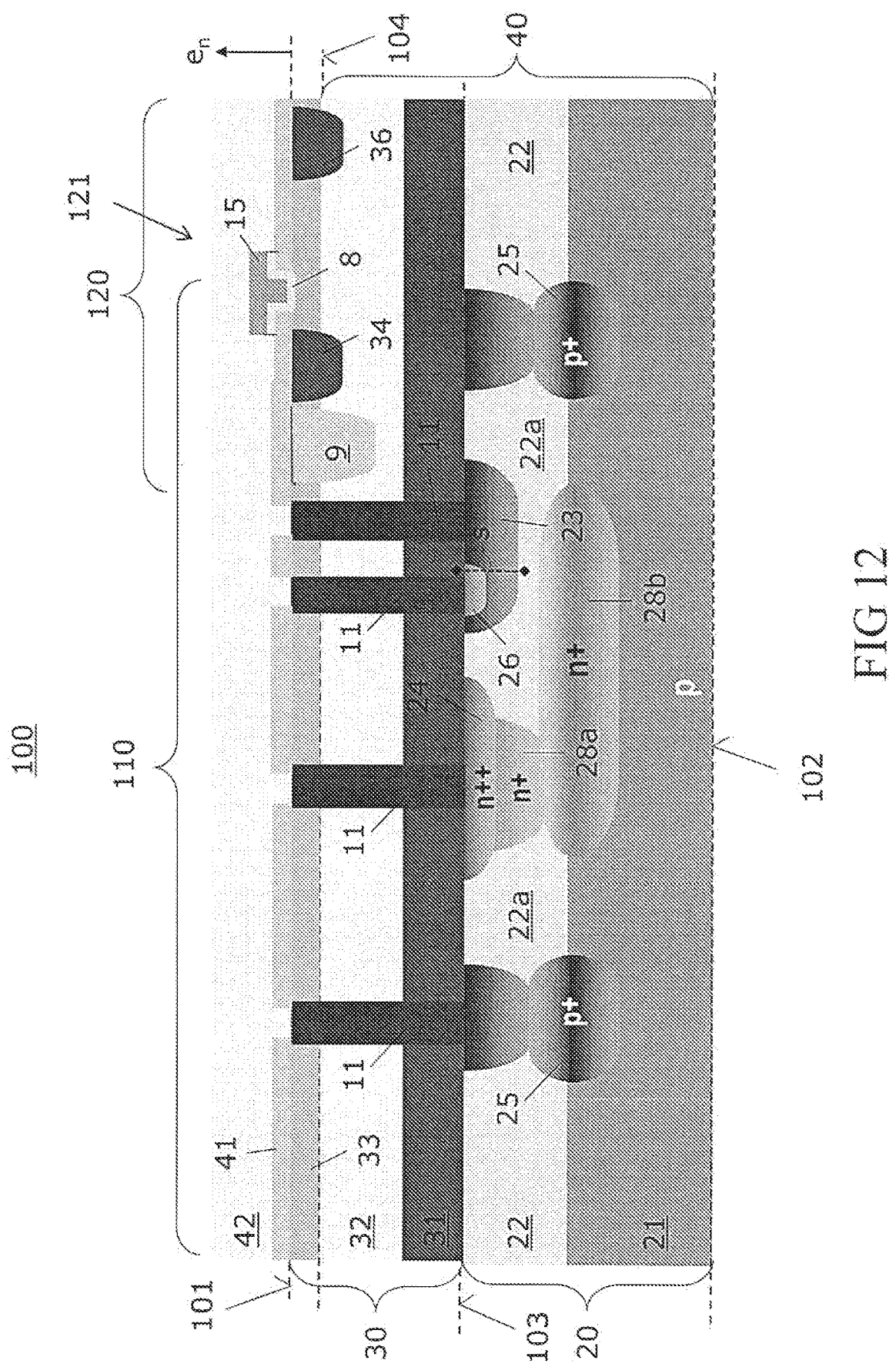

Thereafter, an insulated gate electrode 15 of the HEMT-structure 121 may be formed. This may be achieved by recessing the AlGaN-layer 32 between the source region 34 and drain region 26, and forming a gate dielectric 8 and a gate electrode 15 on the gate dielectric 8. The resulting semiconductor structure is illustrated in FIG. 12 after further depositing of an insulating layer 42 on the upper surface 101. The insulating layer 42 may be formed as an oxide layer, for example as a TEOS-layer (TetraEthylOrthoSilicat-layer), an USG-layer (Undoped Silicate Glass-layer), or a doped oxide layer, for example a PSG-layer (PhosphoSilicate Glass), a BPSG-layer (BoroPhosphoSilicate Glass) or a BSG-layer (BoroSilicate Glass). The TEOS-layer may be formed as a thermal TEOS or plasma enhanced TEOS (PETEOS).

After etching further trenches through the oxide layer 42 and filling the further trenches with a metal plugs 12, 12a, 12b, an integrated semiconductor device 100 as illustrated in FIG. 1 is obtained.

The method of producing the semiconductor device 100 explained with regard to FIGS. 7 to 12 and FIG. 1 may also be described as providing a <111>-silicon wafer 20 with a first surface 103, i.e. a <111>-surface, defining a vertical direction, forming in the <111>-silicon wafer 20 at least one of a resistor and a bipolar semiconductor structure 111;

forming at least two wide band-gap semiconductor layers 31, 32, 33 on the <111>-silicon wafer 20 by epitaxial deposition; and forming a HEMT-structure 121 in the at least two wide band-gap semiconductor layers 31, 32, 33.

Figure 13:
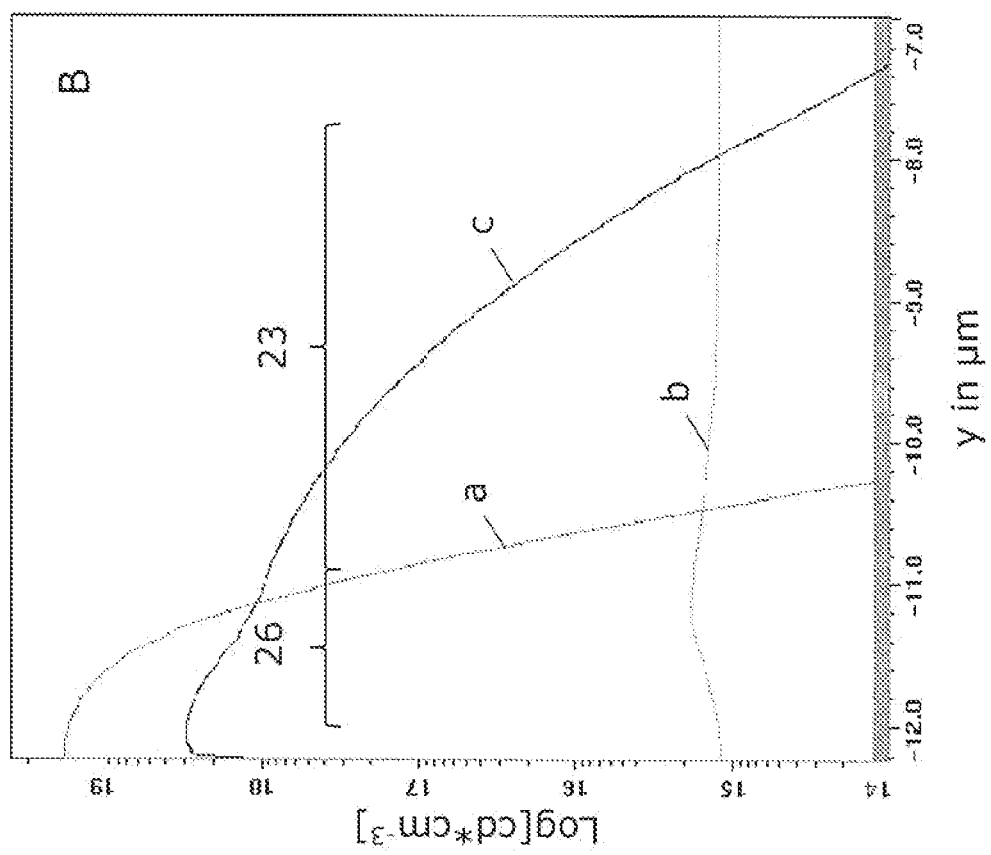
FIGS. 13 and 14 illustrate doping profiles of the semiconductor device of FIG. 1 according to embodiments.
Figure 13:
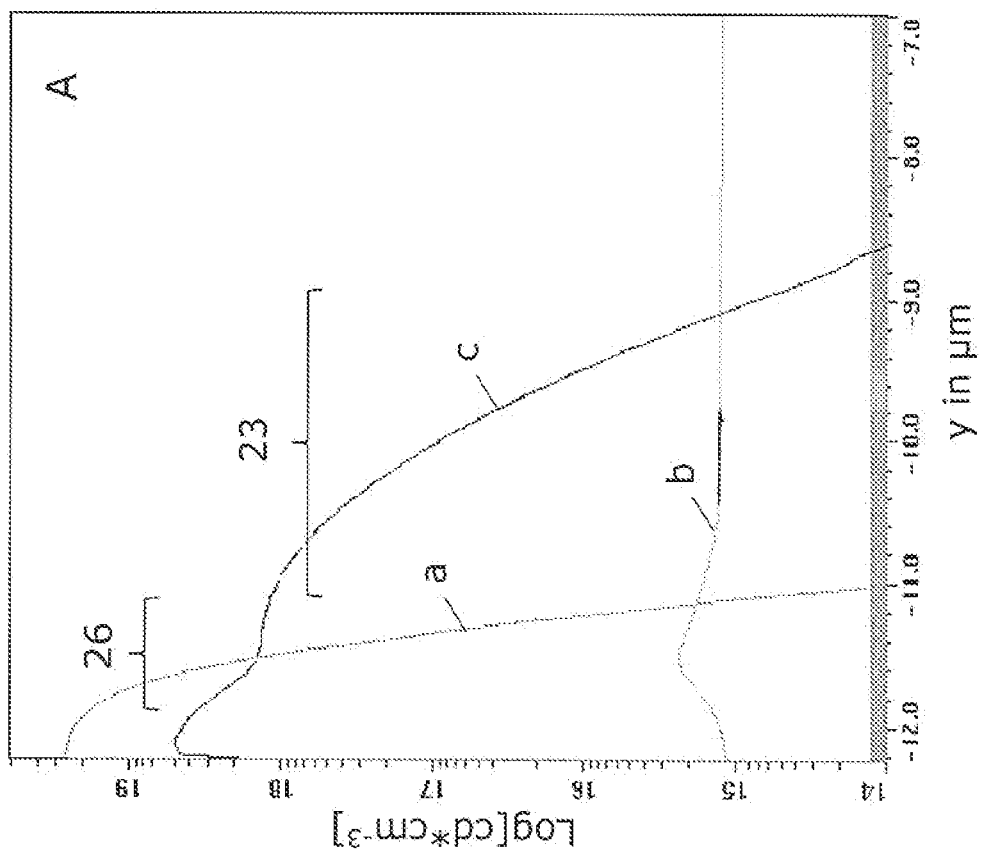
Figure 14:
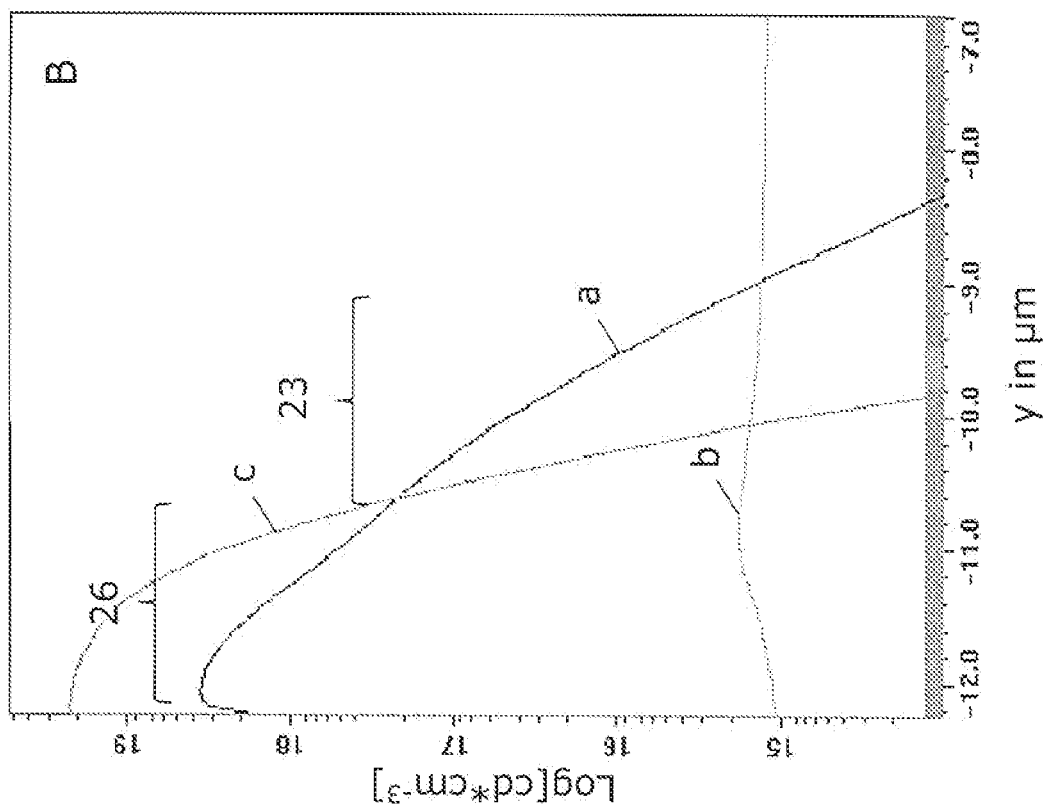
Figure 14:
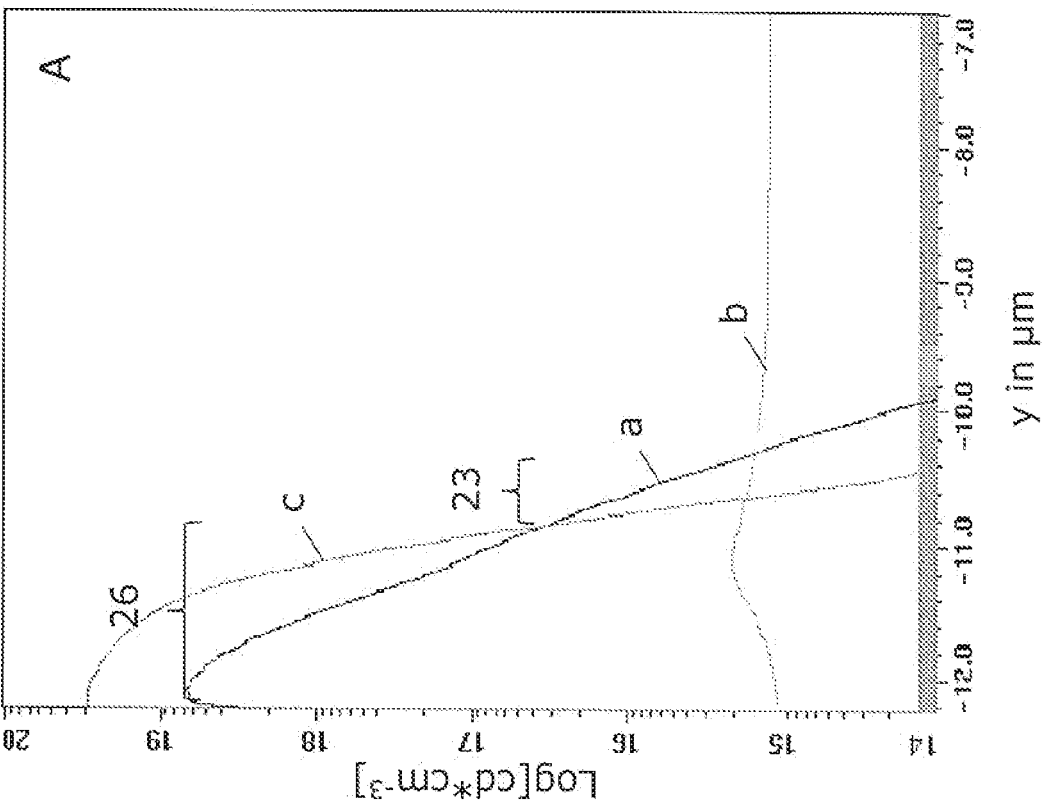
Figure 15:
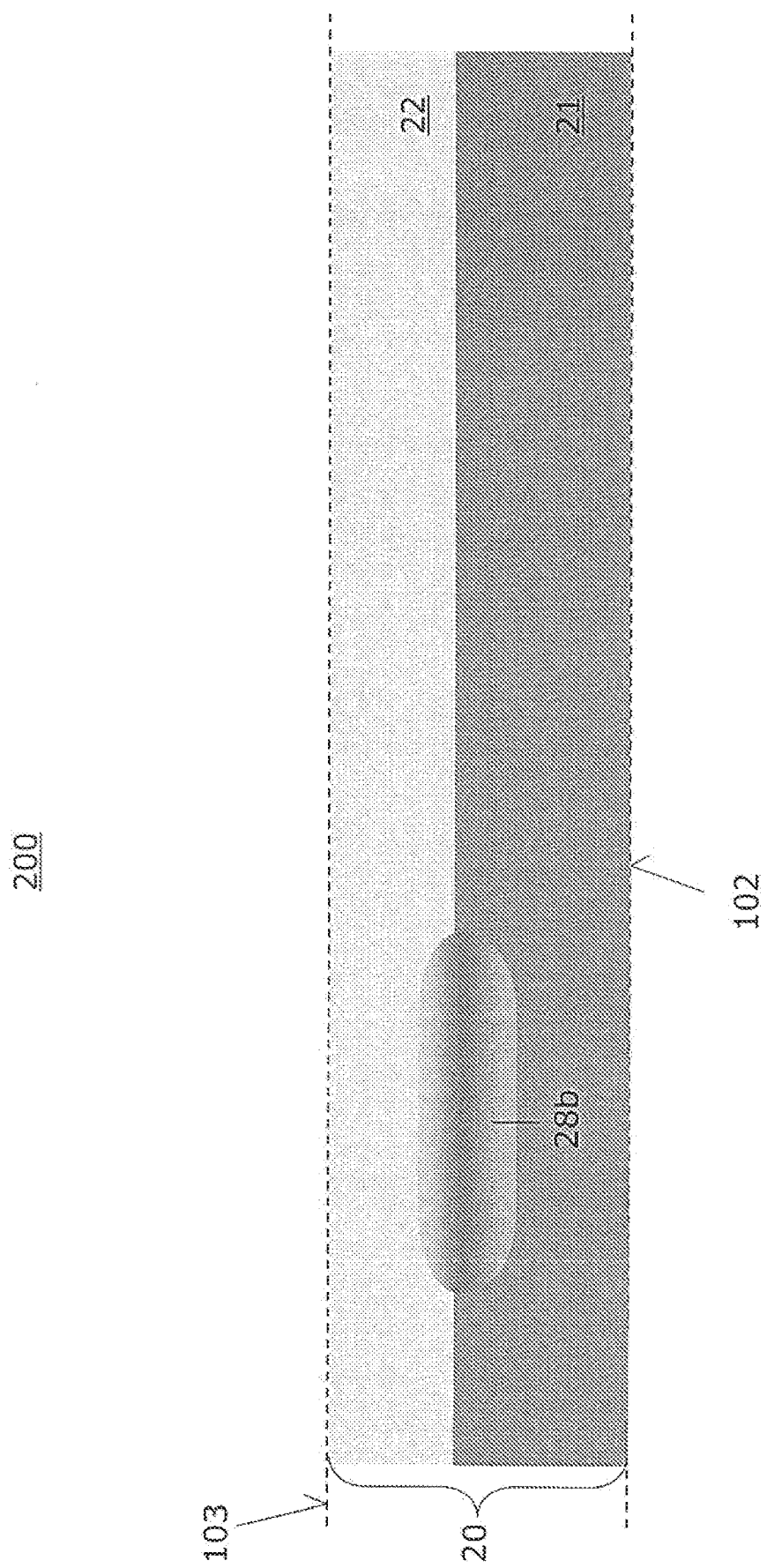
FIGS. 15 to 18 illustrate vertical cross-sections through a semiconductor device during method steps of a method according to further embodiments.

FIGS. 13 and 14 illustrate doping profiles along lines of the semiconductor device of FIG. 1. Curves a, b and c correspond to concentration of arsenic, phosphorus and boron and were obtained by simulation for a manufacturing process as explained above with regard to FIGS. 7 to 12. For the curves illustrated in FIGS. 13A and 13B, arsenic and boron where implanted in phosphorous doped (n-type) silicon. The resulting concentration profiles a, b, c were obtained using a two hour annealing at 1100° C. and 1200° C., respectively, as used for the GaN/AlGaN processes. For the curves illustrated in FIGS. 14A and 14B, firstly arsenic was implanted an annealed for two hours at 1100° C. for forming the emitter region 26. This was followed by implantation of boron for forming the base region 23. The resulting final concentration profiles a, b, c were obtained using again the two hour annealing of 1100° C. (FIG. 14A) and 1200° C. (FIG. 14B) corresponding to GaN/AlGaN processes. In particular the resulting concentrations profiles illustrated in FIG. 14B are well suited for bipolar transistors.

FIGS. 15 to 18 illustrate vertical cross-sections through a semiconductor device 200 during method steps of a method according to further embodiments. FIGS. 15 to 18 show vertical cross-sections through the semiconductor device 200 during or after particular method steps. In a first process, a semiconductor body 20, typically a Si-wafer or Si-substrate 20, having a <111>-surface 103 defining a vertical direction $e_n$ and a back surface 102 which is opposite the <111>-surface 103 is provided. Typically, the semiconductor body 20 includes a first semiconductor layer 21 (p-type) or common substrate 21 extending to the back surface 102 and a second semiconductor layer 22 (n-type) extending to the <111>-surface 103. The first and second semiconductor layers 21, 22 form a pn-junction. Further an n-type buried layer 28b is usually located between the first and second semiconductor layers 21, 22 and across the pn-junction.

Thereafter, a second semiconductor body 30 is formed on the first semiconductor body 20 using epitaxial deposition. Typically, substantially non-doped GaN is epitaxially deposited on the <111>-surface 103 to form a buffer layer 31. As explained above, epitaxial growth of GaN on <111>-silicon may be performed at temperatures of about 1000° C. to about 1200° C. A further substantially non-doped GaN-layer 32 is epitaxially deposited on the buffer layer 31. On the substantially non-doped GaN-layer 32 an undoped or slightly n-doped AlGaN-layer 33 is epitaxially deposited to form a heterojunction 104 between the wide band-gap semiconductor layers 32, 33.

Figure 16:
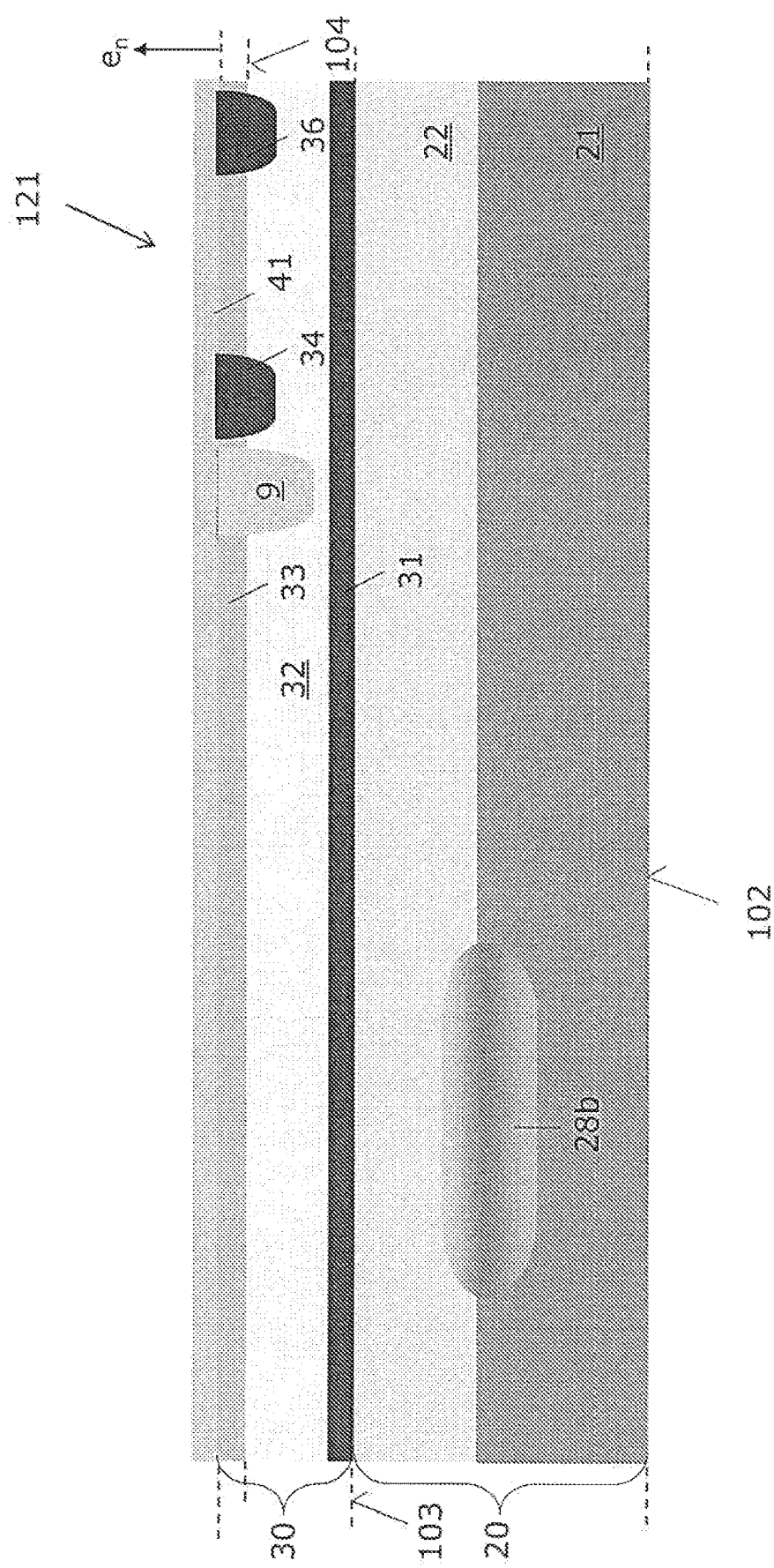

Thereafter, an n⁺-type source region 34 and an n⁺-type drain region 36 of a HEMT-structure 121 as well as a lateral insulation 9 and SiN-layer 41 are formed similar as explained above with regard to FIG. 9. The resulting semiconductor structure 200 is illustrated in FIG. 16.

Thereafter, the wide band-gap semiconductor layers 31, 32, 33 are partly removed from the first semiconductor body 20, typically by etching, to expose a portion of the <111>-surface 103.

Figure 17:
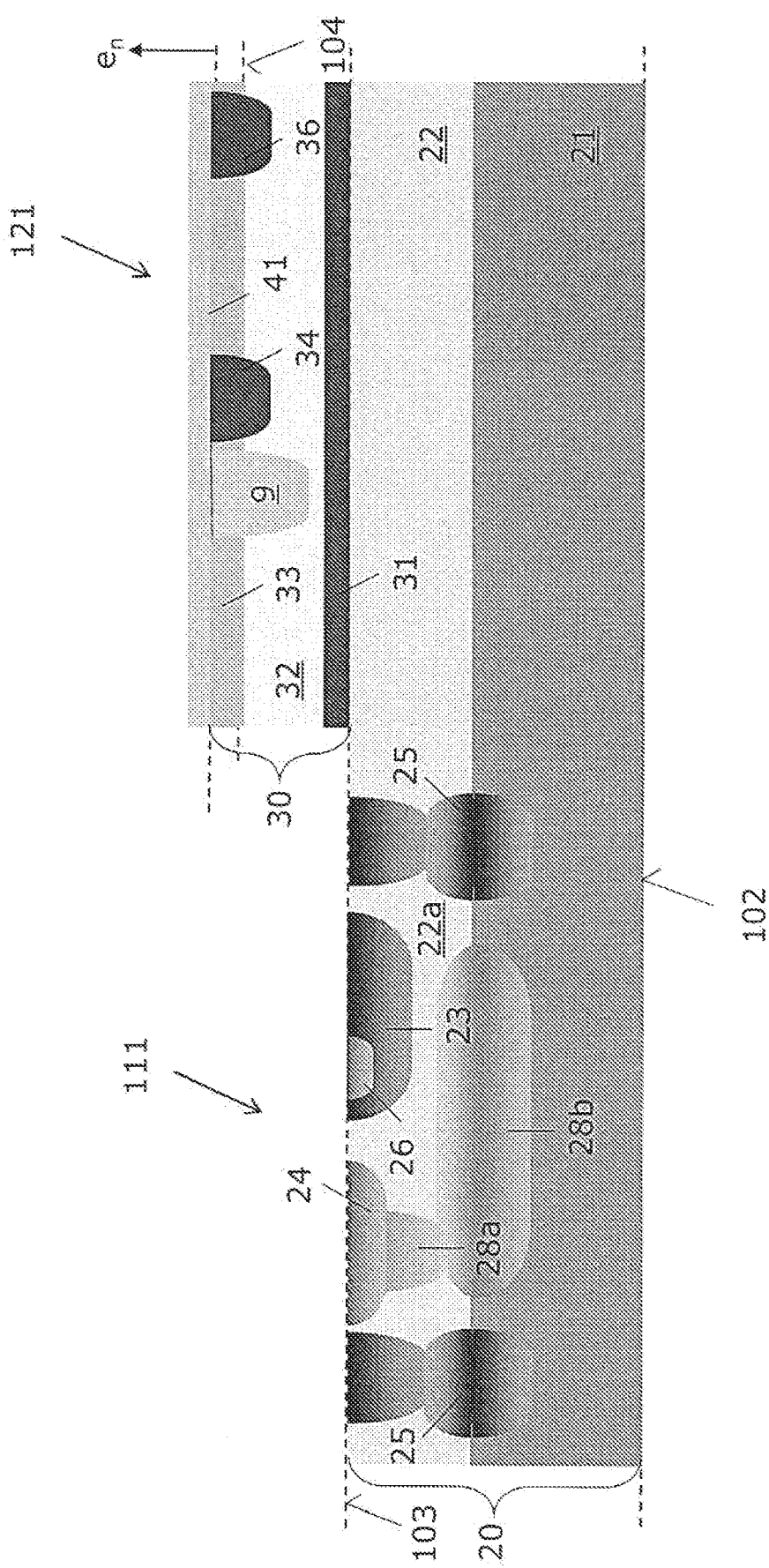

Thereafter, an electronic component 111, for example a bipolar transistor as illustrated in FIG. 17, is formed in the first semiconductor body 20 below the exposed <111>-surface 103. The resulting semiconductor structure 200 is illustrated in FIG. 17. Alternatively or in addition, a resistor, a diode, a field effect structure or a complete CMOS-circuit may be formed in the first semiconductor body 20.

Figure 18:
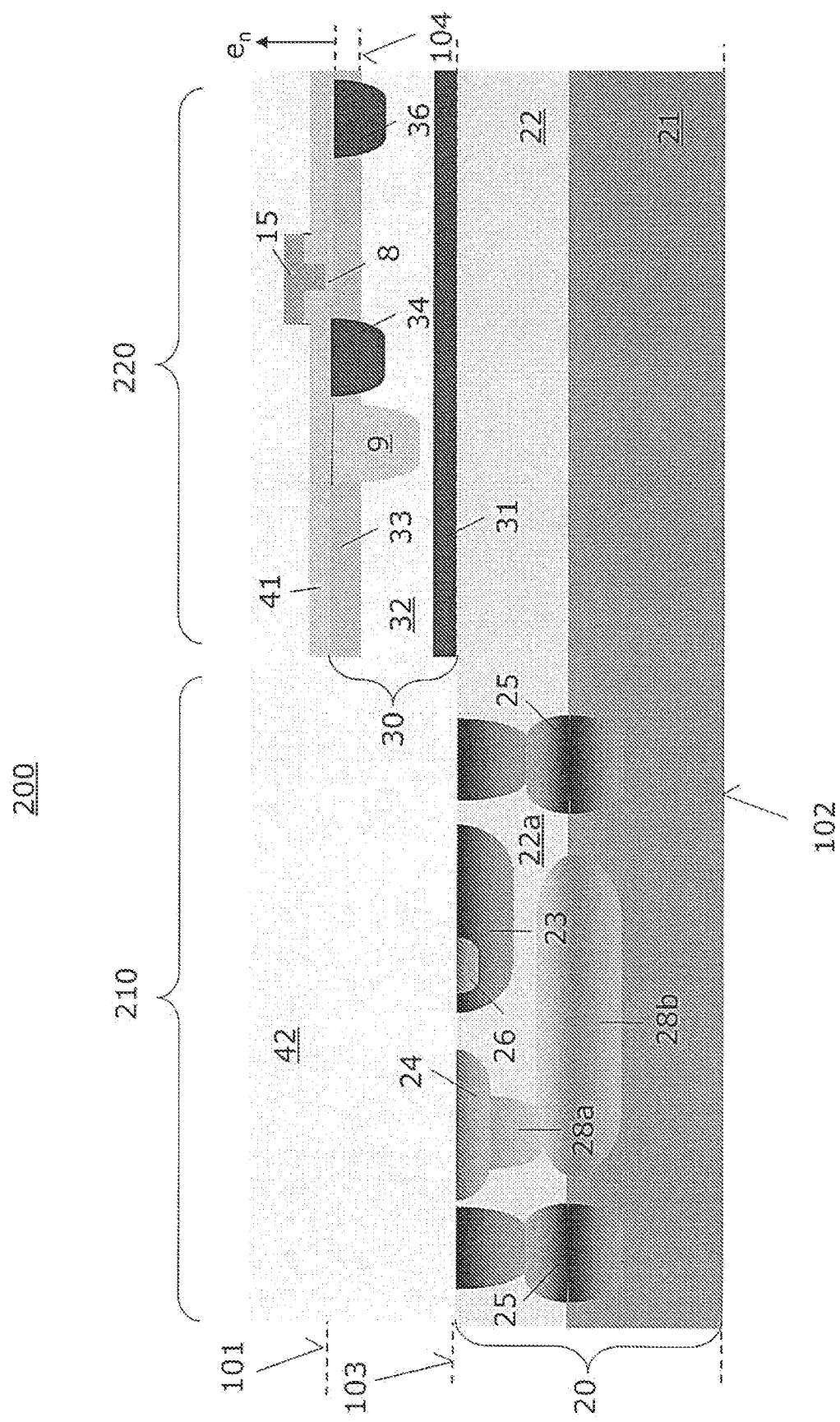

Thereafter, an insulated gate electrode 15 of the HEMT-structure 121 may be formed. This may include recessing the AlGaN-layer 32 between the source region 34 and the drain region 26, forming a gate dielectric 8 and a gate electrode 15 on the gate dielectric 8. The resulting semiconductor structure is illustrated in FIG. 18 after further forming a substantially flat insulating layer 42 on the exposed portion of the <111>-surface 103 and HEMT-structure 121. The insulating layer 42 may be formed as an oxide layer, for example as a TEOS-layer, an USG-layer, or a doped oxide layer.

To electrically contact the electronic component 111 in the first semiconductor body 20 and the HEMT-structure 121, metal plugs 12, 12a, 12b are formed through the insulating layers 41, 42. Typically, forming of metal plugs 12, 12a, 12b includes etching of vertical trenches through the insulating layers 41, 42, depositing a metal or a doped poly-Si, and back-etching and/or a CMP-process stopping at the upper insulating layer 42. The resulting semiconductor structure is illustrated in FIG. 5. The gate electrode 15 is typically connected via a further metal plug in a different vertical cross-section.

The method for producing the semiconductor device 200 explained with regard to FIGS. 15 to 18 and FIG. 5 may also be described as providing a <111>-silicon wafer 20 with a first surface 103 defining a vertical direction; forming at least two wide band-gap semiconductor layers 31, 32, 33 on the <111>-silicon wafer 20 by epitaxial deposition to form a heterojunction 104 above the first surface 103; partly removing the at least two wide band-gap semiconductor layers (31, 32, 33) to expose a portion of the first surface 103; and forming a HEMT-structure 121 above the first surface 103 and at least one electronic component 111 below the heterojunction. Typically, at least the source region 34 and the drain region 36 of the HEMT-structure 121 are formed prior to forming active regions of the electronic component 111 such as a base region 23, an emitter region 26 and a collector region 24 of a bipolar transistor.

The methods for producing a semiconductor device as explained herein have in common that a GaN/AlGaN HEMT-structure is formed on a <111>-silicon semiconductor substrate, typically a <111>-wafer, in which silicon components are formed using standard Si-technology. Due to using a <111>-silicon semiconductor substrate, direct epitaxial deposition of GaN is facilitated on silicon. Accordingly, no further oxide layer is required between the different semiconductor materials. Thus manufacturing processes may be simplified. Furthermore, the silicon components and the HEMT-structure may at least partially overlap when seen in vertical direction. Accordingly, wafer area and thus costs may be reduced.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of producing a semiconductor device, comprising:
    providing a silicon substrate having a <111>-surface defining a vertical direction;
    forming in the silicon substrate at least one electronic component, the electronic component disposed in a well of a first conductivity type, the electronic component comprising an active device region of a second conductivity type opposite the first conductivity type extending from the <111>-surface into the well and forming a p-n junction with the well;
    forming a well-isolating region of the second conductivity type extending from the <111>-surface at least partially into the silicon substrate and laterally surrounding the well, the well-isolating region electrically decoupling the electronic component disposed in the well from a neighboring electronic component formed in the silicon substrate,
    forming a second semiconductor body in contact with the <111>-surface of the silicon substrate and comprising first and second lateral sections that are laterally adjacent to one another and a heterojunction extending throughout the first and second lateral sections;
    forming in the first lateral section an HEMT-structure comprising a channel formed at the heterojunction and a gate electrode arranged above the channel
    forming a conductive plug extending directly from the active device region through the heterojunction in the second lateral section of the second semiconductor body to a surface of the second semiconductor body, and
    wherein the HEMT-structure is formed to partially overlap with the active device region of the electronic component in the vertical direction.

2. The method of claim 1, wherein the at least one electronic component is selected from a group consisting of a bipolar component, a FET-component and a resistor.

3. The method of claim 1, wherein forming the second semiconductor body comprises at least one of:
    epitaxial depositing GaN to form a buffer layer in contact with the <111>-surface;
    epitaxial depositing $Al_xGa_{(1-x)}N$-layers to form a buffer layer on the <111>-surface;
    epitaxial depositing a superlattice structure to form a buffer layer on the <111>-surface;
    epitaxial depositing a GaN-layer on the buffer layer;
    epitaxial depositing an AlN-layer on the GaN-layer; and
    epitaxial depositing $In_xAl_yGa_{(1-x-y)}N$ on the GaN-layer.

4. The method of claim 1, further comprising partly removing the at least two epitaxial semiconductor layers to expose a portion of the silicon substrate prior to forming the at least one electronic component.

5. The method of claim 1, wherein the at least one electronic component is at least partially formed after forming the heterojunction.

6. The method of claim 1, wherein the at least one electronic component is formed as a FET-structure.

7. The method of claim 1, wherein, prior to forming the heterojunction, the at least one electronic component is formed as a bipolar component and/or a resistor.

* * * * *